(12) United States Patent
Hua et al.

(10) Patent No.: US 11,847,263 B2
(45) Date of Patent: Dec. 19, 2023

(54) HAPTIC FEEDBACK BASE PLATE, HAPTIC FEEDBACK APPARATUS AND HAPTIC FEEDBACK METHOD

(71) Applicants: Beijing BOE Technology Development Co., Ltd., Beijing (CN); BOE Technology Group Co., Ltd., Beijing (CN)

(72) Inventors: Hui Hua, Beijing (CN); Yuju Chen, Beijing (CN); Xiaofeng Yin, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 110 days.

(21) Appl. No.: 17/620,538

(22) PCT Filed: Feb. 26, 2021

(86) PCT No.: PCT/CN2021/078073
§ 371 (c)(1),
(2) Date: Dec. 17, 2021

(87) PCT Pub. No.: WO2022/178807
PCT Pub. Date: Sep. 1, 2022

(65) Prior Publication Data
US 2023/0152892 A1 May 18, 2023

(51) Int. Cl.
G09G 5/00 (2006.01)
G06F 3/01 (2006.01)
B06B 1/06 (2006.01)

(52) U.S. Cl.
CPC ............ *G06F 3/016* (2013.01); *B06B 1/0622* (2013.01)

(58) Field of Classification Search
None
See application file for complete search history.

(56) References Cited

U.S. PATENT DOCUMENTS

2003/0067449 A1* 4/2003 Yoshikawa ............ G06F 3/016
345/173
2010/0231657 A1 9/2010 Takahashi
(Continued)

FOREIGN PATENT DOCUMENTS

CN 101632054 A 1/2010
CN 103247461 A 8/2013
(Continued)

*Primary Examiner* — Carl Adams
(74) *Attorney, Agent, or Firm* — IPro, PLLC

(57) ABSTRACT

The present disclosure provides a haptic feedback base plate, a haptic feedback apparatus and a haptic feedback method. The haptic feedback base plate comprises: a substrate and a deformation unit disposed on one side of the substrate. The deformation unit comprises a first electrode, a piezoelectric material layer and a second electrode that are arranged in a stacked manner, the first electrode is arranged close to the substrate, the first electrode and the second electrode are configured to form an alternating electric field, and the piezoelectric material layer vibrates under the effect of the alternating electric field and drives the substrate to resonate, wherein a difference between a frequency of the alternating electric field and an inherent frequency of the substrate is less than or equal to a preset threshold.

14 Claims, 10 Drawing Sheets

(56) References Cited

U.S. PATENT DOCUMENTS

| | | | |
|---|---|---|---|
| 2011/0043477 A1 | 2/2011 | Park et al. | |
| 2013/0199911 A1 | 8/2013 | Sato et al. | |
| 2017/0092838 A1 | 3/2017 | Konishi et al. | |
| 2018/0150164 A1 | 5/2018 | Naganuma | |
| 2019/0079584 A1* | 3/2019 | Bonanno | G06F 3/03543 |
| 2019/0363241 A1 | 11/2019 | Huang | |

FOREIGN PATENT DOCUMENTS

| | | |
|---|---|---|
| CN | 107017334 A | 8/2017 |
| CN | 108846318 A | 11/2018 |
| CN | 109240485 A | 1/2019 |
| CN | 111749874 A | 10/2020 |
| CN | 111769080 A | 10/2020 |
| JP | 2014197576 A | 10/2014 |

\* cited by examiner

HAPTIC FEEDBACK BASE PLATE, HAPTIC FEEDBACK APPARATUS AND HAPTIC FEEDBACK METHOD

TECHNICAL FIELD

The present disclosure relates to the technical field of haptic feedback, in particular to a haptic feedback base plate, a haptic feedback apparatus and a haptic feedback method.

BACKGROUND

With the development of technologies, touch screens have been used more and more widely and gradually become one of the most convenient human-computer interaction devices. In recent years, to further improve the usage experience of human-computer interaction, the haptic feedback technique has emerged and gained more and more attention and research.

SUMMARY

The present disclosure discloses a haptic feedback base plate, comprising:

a substrate and a deformation unit disposed on one side of the substrate, wherein the deformation unit comprises a first electrode, a piezoelectric material layer and a second electrode which are arranged in a stacked manner, the first electrode is arranged close to the substrate, the first electrode and the second electrode are configured to form an alternating electric field, and the piezoelectric material layer vibrates under the effect of the alternating electric field and drives the substrate to resonate;

wherein, a difference between a frequency of the alternating electric field and an inherent frequency of the substrate is less than or equal to a preset threshold.

In an optional implementation, the deformation unit is arranged at a vibration crest and/or a vibration trough of the substrate.

In an optional implementation, further comprising:

a bind electrode disposed on a same layer with the first electrode, wherein the bind electrode is arranged close to an edge of the substrate and is configured to connect a drive voltage input terminal, and a voltage signal input by the drive voltage input terminal is an alternating voltage signal; and an insulating layer and a trace layer that are disposed on a side, away from the substrate, of the second electrode, wherein the trace layer comprises a trace having one end connected to the second electrode through a first via hole formed in the insulating layer and the other end connected to the bind electrode through a second via hole formed in the insulating layer.

In an optional implementation, further comprising:

a lead electrode disposed on a same layer with the first electrode, wherein the lead electrode is connected to the first electrode and is configured to connect a grounding voltage input terminal, and a voltage signal input by the grounding voltage input terminal is a grounding voltage signal.

In an optional implementation, when the lead electrode is connected to a plurality of the first electrodes, resistances between the lead electrode and each of the plurality of the first electrodes are equal.

In an optional implementation, a plurality of the deformation units are provided, the plurality of the deformation units are arranged on one side of the substrate in an array, the first electrodes of the deformation units in a same column are communicated with each other, and the second electrodes of the deformation units in the same column are connected to a same trace in the trace layer.

In an optional implementation, in a plane parallel to the substrate, a size of the deformation unit is less than a half-wavelength of vibrations of the substrate.

In an optional implementation, a thickness of the piezoelectric material is greater than or equal to 1 µm and less than or equal to 10 µm.

In an optional implementation, edges of the second electrode are indented relative to edges of the piezoelectric material layer.

In an optional implementation, indentation distances of the edges of the second electrode relative to the edges of the piezoelectric material layer are greater than or equal to 100 µm and less than or equal to 500 µm.

In an optional implementation, the edges of the piezoelectric material layer are indented relative to edges of the first electrode.

The present disclosure provides a haptic feedback apparatus, comprising the above haptic feedback base plate.

In an optional implementation, further comprising: a displaying substrate disposed on a side, away from the substrate, of the deformation unit, wherein the displaying substrate comprises an active area and a peripheral area located on a periphery of the active area, and an orthographic projection of the deformation unit on the displaying substrate is located within the peripheral area.

In an optional implementation, a touch electrode layer or a touch film is disposed on a side, close to the displaying substrate, of the substrate, and an orthographic projection of the touch electrode layer or the touch film on the displaying substrate covers the active area.

The present disclosure provides a haptic feedback method being applied to the above haptic feedback base plate, and the method comprises:

applying voltage signals to the first electrode and the second electrode, respectively, to form an alternating electric field between the first electrode and the second electrode, and enabling the piezoelectric material layer to vibrate under the effect of the alternating electric field and drive the substrate to resonate, wherein a difference between a frequency of the alternating electric field and an inherent frequency of the substrate is less than or equal to a preset threshold.

The aforesaid description is merely a brief summary of the technical solution of the present disclosure. To allow those skilled in the art to gain a better understanding of the technical means of the present disclosure so as to implement the present disclosure according to the contents in the specification and to make the above and other purposes, features and advantages of the present disclosure clearer, specific implementations of the present disclosure are given below.

BRIEF DESCRIPTION OF THE DRAWINGS

To more clearly explain the technical solutions of the embodiments of the present disclosure or the prior art, drawings used for describing the embodiments of the present disclosure or the prior art will be briefly introduced below. Obviously, the drawings in the following description only illustrate some embodiments of the present disclosure, and those ordinarily skilled in the art can obtain other drawings according to the following ones without creative labor.

DETAILED DESCRIPTION

To clarify the purposes, technical solutions and advantages of the embodiments of the present disclosure, the technical solutions of the embodiments of the present disclosure will be clearly and completely described below in conjunction with the drawings of the embodiments of the present disclosure. Obviously, the embodiments in the following description are merely illustrative ones, and are not all possible ones of the present disclosure. All other embodiments obtained by those ordinarily skilled in the art based on the following ones without creative labor should also fall within the protection scope of the present disclosure.

Figure 1:
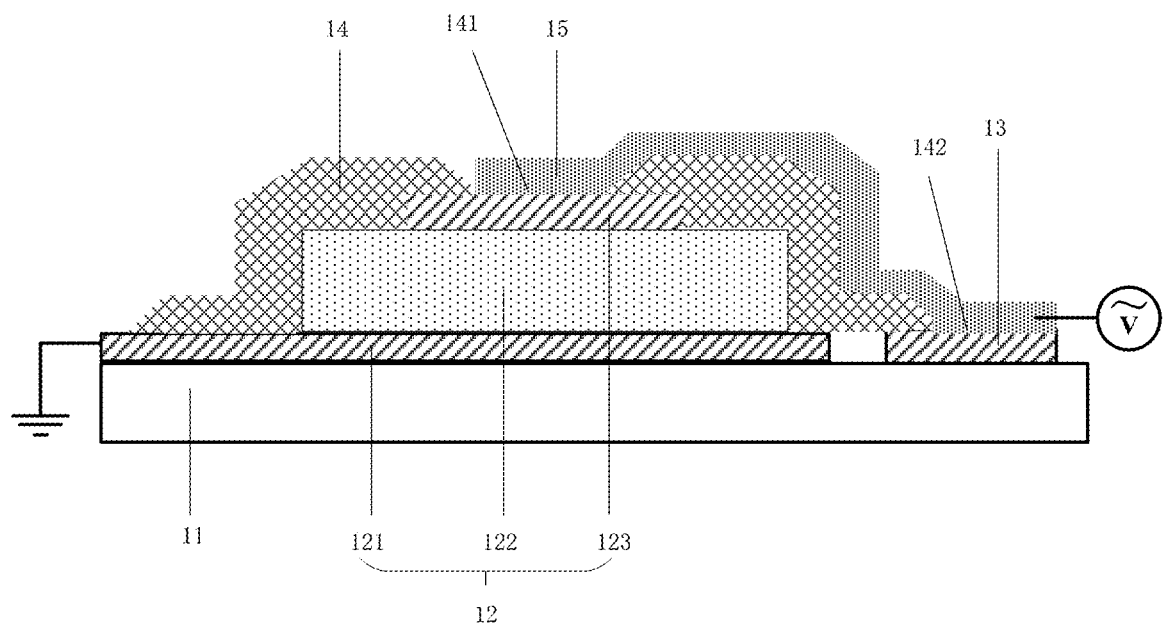
FIG. 1 illustrates a sectional structural view of a haptic feedback base plate according to one embodiment of the present disclosure.

One embodiment of the present disclosure provides a haptic feedback base plate. Referring to FIG. 1, the haptic feedback base plate comprises: a substrate 11 and a deformation unit 12 disposed on one side of the substrate 11, wherein the deformation unit 12 comprises a first electrode 121, a piezoelectric material layer 122 and a second electrode 123 that are arranged in a stacked manner, the first electrode 121 is arranged close to the substrate 11, the first electrode 121 and the second electrode 123 are configured to form an alternating electric field, and the piezoelectric material layer 122 vibrates under the effect of the alternating electric field and drives the substrate 11 to resonate; and a difference between a frequency of the alternating electric field and an inherent frequency of the substrate 11 is less than or equal to a preset threshold.

Wherein, the substrate 11 may be a glass substrate or the like, and this embodiment has no limitation in this aspect.

For example, the first electrode 121 and the second electrode 123 may be made of a transparent electrode material such as ITO to improve the transmittance of the haptic feedback base plate. The present disclosure has no limitation to the specific material of the first electrode 121 and the second electrode 123.

The piezoelectric material layer 122 may be made of an inorganic piezoelectric material such as piezoelectric crystals or piezoelectric ceramic, or may be made of an organic piezoelectric material such as polyvinylidene fluoride, and this embodiment has no limitation in this aspect. Wherein, the piezoelectric material is able to realize mutual conversion between mechanical vibrations and alternating currents.

Wherein, the inherent frequency of the substrate 11 is also referred to as natural frequency. When an object, such as the substrate 11, vibrates freely, the displacement of the object sinusoidally or cosinoidally varies with time, and the vibration frequency is unrelated with initial conditions, and is only related to inherent properties of the object (such as mass, shape and material).

In specific implementation, referring to FIG. 1, for example, a grounding voltage signal is applied to the first electrode 121, and an alternating voltage signal is applied to the second electrode 123, such that an alternating electric field is formed between the first electrode 121 and the second electrode 123, wherein the frequency of the alternating electric field is the same as the frequency of the alternating voltage signal. Under the effect of the alternating electric field, the piezoelectric material layer 122 deforms and generates a vibration signal, the frequency of which is the same as the frequency of the alternating electric field; and when the frequency of the vibration signal is close or equal to the inherent frequency of the substrate 11, the substrate 11 vibrates synchronously to increase the vibration amplitude to generate a haptic feedback signal, so users may obviously feel the change of the friction when touching the surface of the substrate 11 with their fingers. In actual application, the friction on the surface of the substrate 11 may be controlled by means of synchronous vibrations between the piezoelectric material layer 122 and the substrate 11, such that the texture of objects is represented on the surface of the substrate 11.

With the increase of the voltage of the alternating voltage signal, the amplitude of vibrations of the substrate 11 will be increased, and the haptic experience of users will become more and more obvious. Thus, the intensity of the haptic feedback signal may be controlled by regulating the voltage of the alternating voltage signal.

According to the haptic feedback base plate in this embodiment, voltage signals are applied to the first electrode and the second electrode respectively to form an alternating electric field between the first electrode and the second electrode, the piezoelectric material layer deforms under the effect of the alternating electric field, and when the frequency of the alternating electric field is close to the inherent frequency of the substrate, the substrate is driven to resonate to increase the vibration amplitude, such that haptic feedback is realized on the surface of the substrate.

Figure 2:
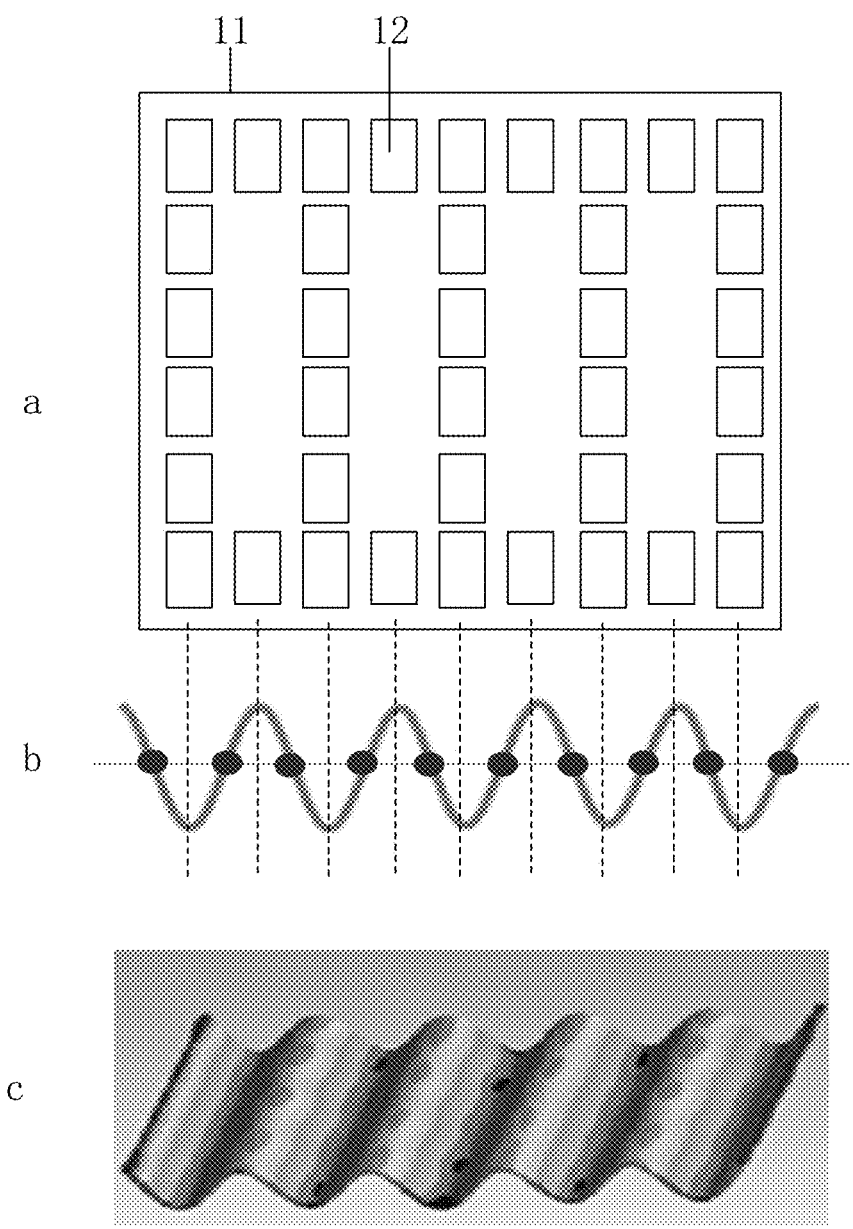
FIG. 2 illustrates a plan structural view and a simulation diagram of a haptic feedback base plate according to one embodiment of the present disclosure.

In an optional embodiment, referring to FIG. 2, the deformation unit 12 may be disposed at a vibration crest and/or vibration trough of the substrate 11.

When one deformation unit 12 is configured, the deformation unit may be located at a crest or trough of a natural vibration mode of the substrate 11. When multiple deformation units 12 are configured, the deformation units 12 may be entirely located at the crests or troughs; or, part of the deformation units 12 are located at the crests, and the other part of the deformation units 12 are located at the troughs. It should be noted that the deformation unit 12 may be disposed near the crest or trough as actually needed to be compatible with multiple natural vibration modes of the substrate 11 (such as 0*6 node, 0*7 node, 0*8 node, 0*9 node and 0*10 node). The specific position of the deformation unit 12 on the substrate 11 may be adjusted to fulfill the purpose of a maximum vibration amplitude, and this embodiment has no limitation in this aspect.

In this embodiment, referring to FIG. 2, multiple deformation units 12 are configured and are arranged on one side of the substrate 11 in an array. When multiple deformation units 12 are configured, each deformation unit 12 is driven separately, or the deformation units 12 in the same column are driven synchronously (column drive), or all the deformation units 12 are driven synchronously. This embodiment has no limitation to the specific drive mode of the multiple deformation units 12. The specific structure of column drive will be introduced in detail in subsequent embodiments.

Refer to FIG. 2, wherein a in FIG. 2 illustrates an arrangement diagram of deformation units on the substrate in this embodiment, b in FIG. 2 illustrates a vibration waveform of the natural vibration mode 0*10 node of the substrate, and c in FIG. 2 illustrates a modal simulation diagram of the natural vibration mode 0*10 node of the substrate. As illustrated by a in FIG. 2, multiple deformation units 12 are arranged on the substrate 11 in axial symmetry. Nine columns of deformation units 12 are arranged on the substrate 11. One column of deformation units 12 is correspondingly arranged on each crest or trough of the natural vibration mode 0*10 node of the substrate, wherein six deformation units 12 are arranged in each odd column, and two deformation units 12 are arranged in each even column and are located in the initial row and the last row in this even column, respectively. When an alternating voltage with a frequency 24.2 kHz and a peak voltage $V_{pp}<35$ V is applied between the first electrode 121 and the second electrode 123 of each deformation unit illustrated by a in FIG. 2, the vibration amplitude of the substrate 11 may be greater than 1 μm, and the wavelength may be less than 15 mm, which accord with the industry standards of commercial haptic display devices. Users may obviously feel the change of friction when touching the surface of the substrate 11 with their fingers, such that haptic feedback is realized.

Wherein, the node refers to a column of points with a constant amplitude 0 in the natural vibration mode of the substrate 11 (corresponding to column drive). The vibration mode 0*10 node indicates that ten columns of points on the substrate 11 have a constant amplitude 0 in this vibration mode, as illustrated by b in FIG. 2.

In actual application, the inherent frequency and natural vibration mode of the substrate 11 may be determined by simulation according to intrinsic parameters of the substrate 11 such as mass, shape and material (in case of multiple inherent frequencies and natural vibration modes, the inherent frequency and natural vibration mode corresponding to a large amplitude are selected), then vibration crests and vibration troughs of the substrate 11 are determined, and after that, the deformation units are disposed at or near the crests and/or troughs.

In specific implementation, when multiple deformation units 12 are disposed in the haptic feedback base plate, the haptic feedback signal will be more uniform with the increase of the vibration amplitude of the substrate 11 in the same vibration mode. The number of deformation units 12 disposed in the haptic feedback base plate may be determined according to the wiring space or other factors, and with the permission of the wiring space, the deformation units 12 may be configured as many as possible. This embodiment has no limitation to the specific number of the deformation units 12.

To enable the deformation units 12 to avoid the nodes of the substrate 11 and ensure that the wavelength is less than 15 mm, in one optional embodiment, in a plane parallel to the substrate 11, the size of the deformation units 12 may be less than the half-wavelength of the vibrations of the substrate 11 in a vibration propagation direction of the substrate 11, that is, the size of the deformation units 12 may be less than the half-wavelength of the natural vibration mode of the substrate 11. For example, when the wavelength of the natural vibration mode of the substrate 11 is 15 mm, the size of the deformation units 12 may be less than 7.5 mm. It should be noted that this embodiment has no limitation to the shape of the deformation units 12, and the deformation units 12 may be rectangular as illustrated by a in FIG. 2, or circular, pentagonal, hexagon, or the like. Wherein, the vibration propagation direction of the substrate 11 is parallel to the row direction of the array of the deformation units illustrated by a in FIG. 2.

In one optional embodiment, the thickness of the piezoelectric material layer 122 may be greater than or equal to 1 μm and less than or equal to 10 μm. For example, the thickness of the piezoelectric material layer 122 may be 2 μm. The piezoelectric material layer 122 is very thin, such that the transmittance of the haptic feedback base plate is high.

Figure 3:
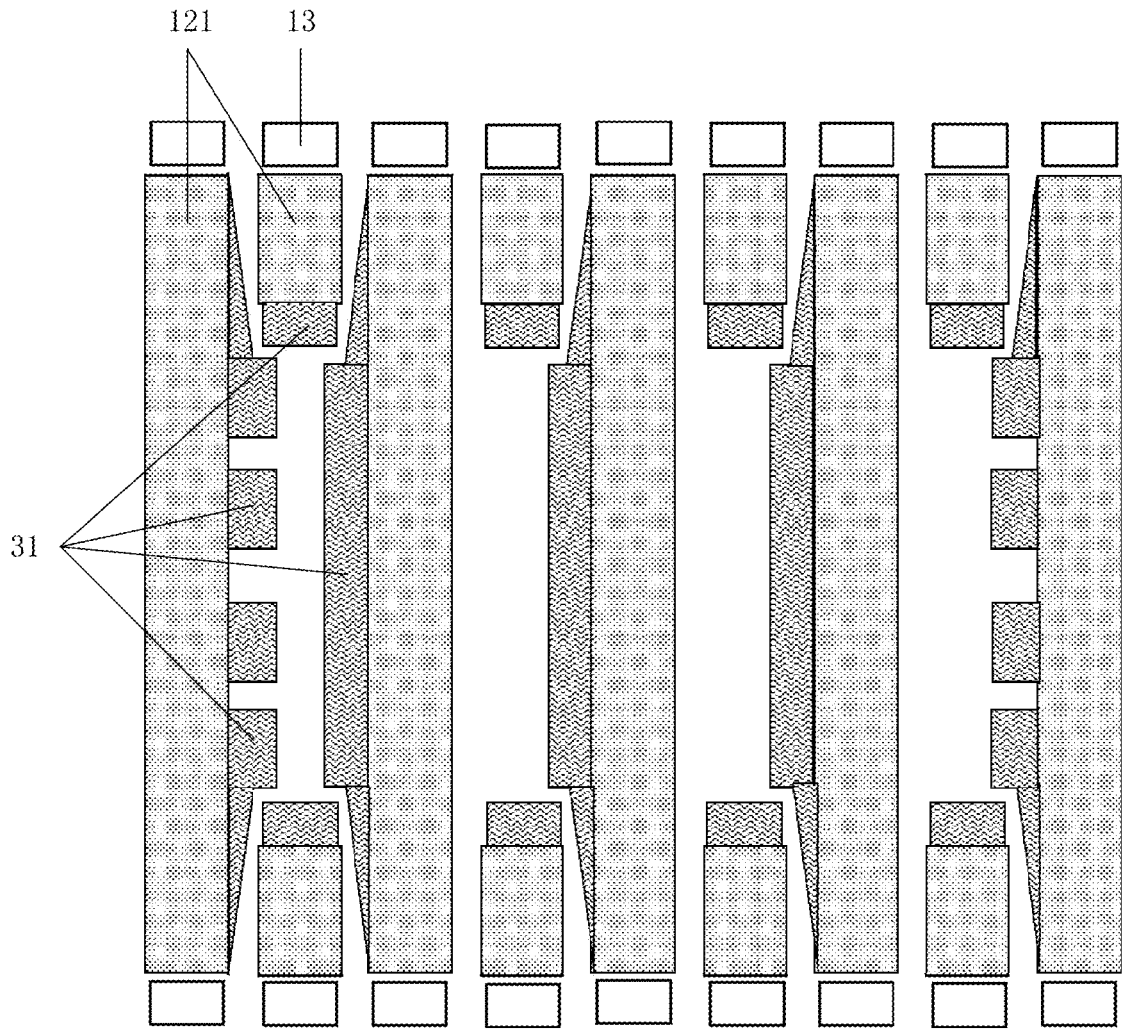
FIG. 3 illustrates a plan structural view of first electrodes according to one embodiment of the present disclosure.

In one optional embodiment, referring to FIG. 1 and FIG. 3, the haptic feedback base plate may further comprise:

A bind electrode 13 disposed on the same layer with the first electrode 121, wherein the bind electrode 13 is arranged close to an edge of the substrate 11 and is connected to a drive voltage input terminal, and a voltage signal input by the drive voltage input terminal is an alternating voltage signal. Wherein, edges, close to each other, of the bind electrode 13 may be edges, parallel to the vibration propagation direction, of the substrate 11, such as a top edge and a bottom edge in FIG. 3.

Referring to FIG. 1, the haptic feedback base plate may further comprise: an insulating layer 14 and a trace layer 15 disposed on a side, away from the substrate 11, of the second electrode 123, wherein the trace layer 15 comprises a trace, one end of the trace is connected to the second electrode 123 through a first via hole 141 formed in the insulating layer 14, and the other end of the trace is connected to the bind electrode 13 through a second via hole 142 formed in the insulating layer 14. Wherein, the frequency of the alternating voltage signal may be close or equal to the inherent frequency of the substrate 11.

In one optional embodiment, referring to FIG. 3, the haptic feedback base plate may further comprise:

A lead electrode 31 disposed on the same layer with the first electrode 121, wherein the lead electrode 31 is connected to the first electrode 121 and is connected to a grounding voltage input terminal, and a voltage signal input by the grounding voltage input terminal is a grounding voltage signal.

In this embodiment, the first electrode 121, the bind electrode 13 and the lead electrode 31 may be made of the same material and formed by the same patterning process.

Figure 4:
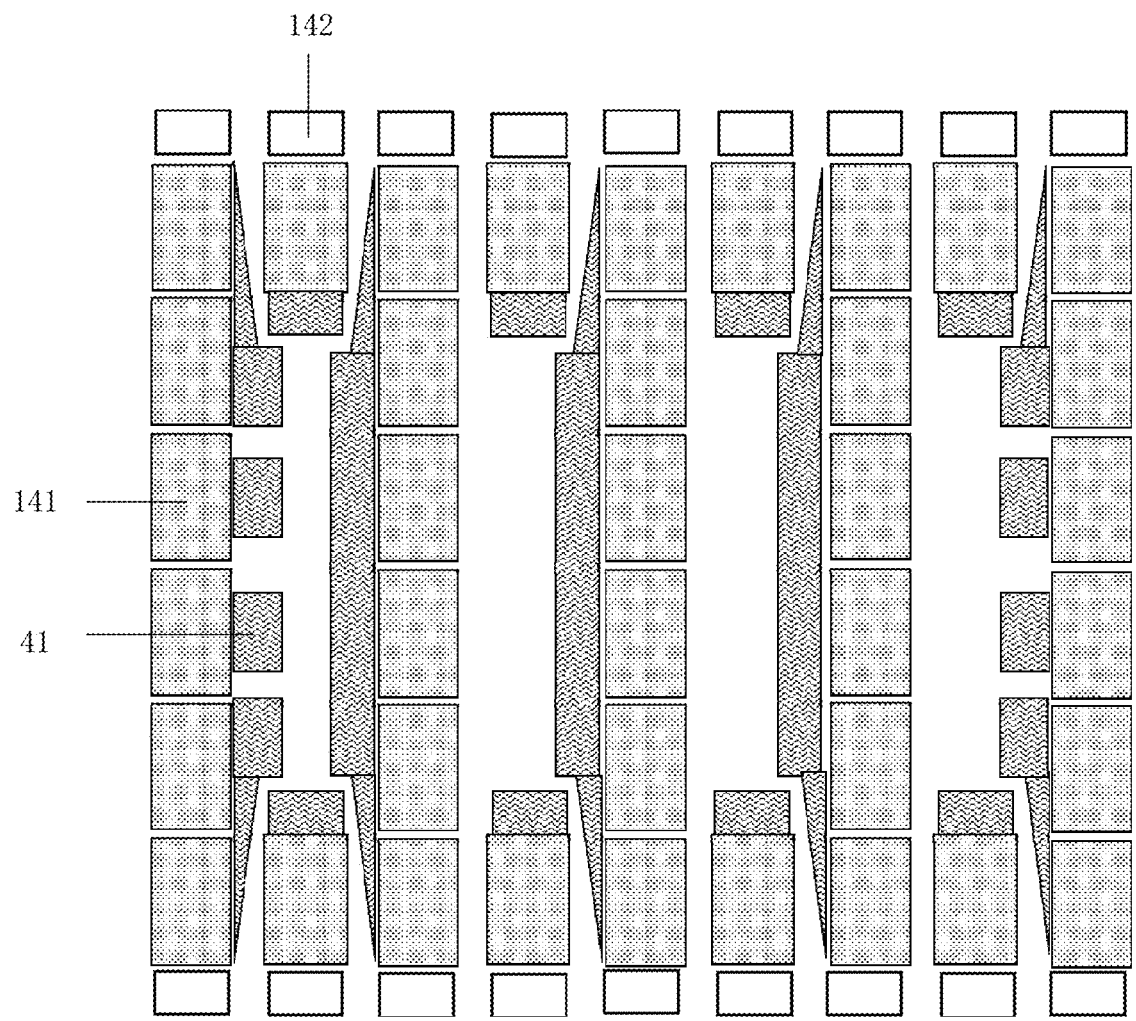
FIG. 4 illustrates a plan structural view of an insulating layer being partially removed according to one embodiment of the present disclosure.

Wherein, the insulating layer 14 may adopt a negative photoresist or a positive photoresist. After the whole surface of the insulating layer 14 is coated or deposited with an insulating layer material, pattern areas shown in FIG. 4 are removed. The insulating layer 14 is arranged for the purpose of covering part of the first electrode 121 to prevent short circuits between the trace layer and other structures. The first via hole 141 is formed in a position, corresponding to the second electrode 123, of the insulating layer 14, and the second via hole 142 is formed in a position, corresponding to the bind electrode 13, of the insulating layer 14, such that one end of the trace in the trace layer is connected to the second electrode 123 through the first via hole 141, and the other end of the trace is connected to the bind electrode 13 through the second via hole 142. A lead electrode via hole 41 may be formed in a position, corresponding to the lead electrode 31, of the insulating layer 14, such that an external lead is connected to the lead electrode 31 with elargol or in other manners.

Figure 5:
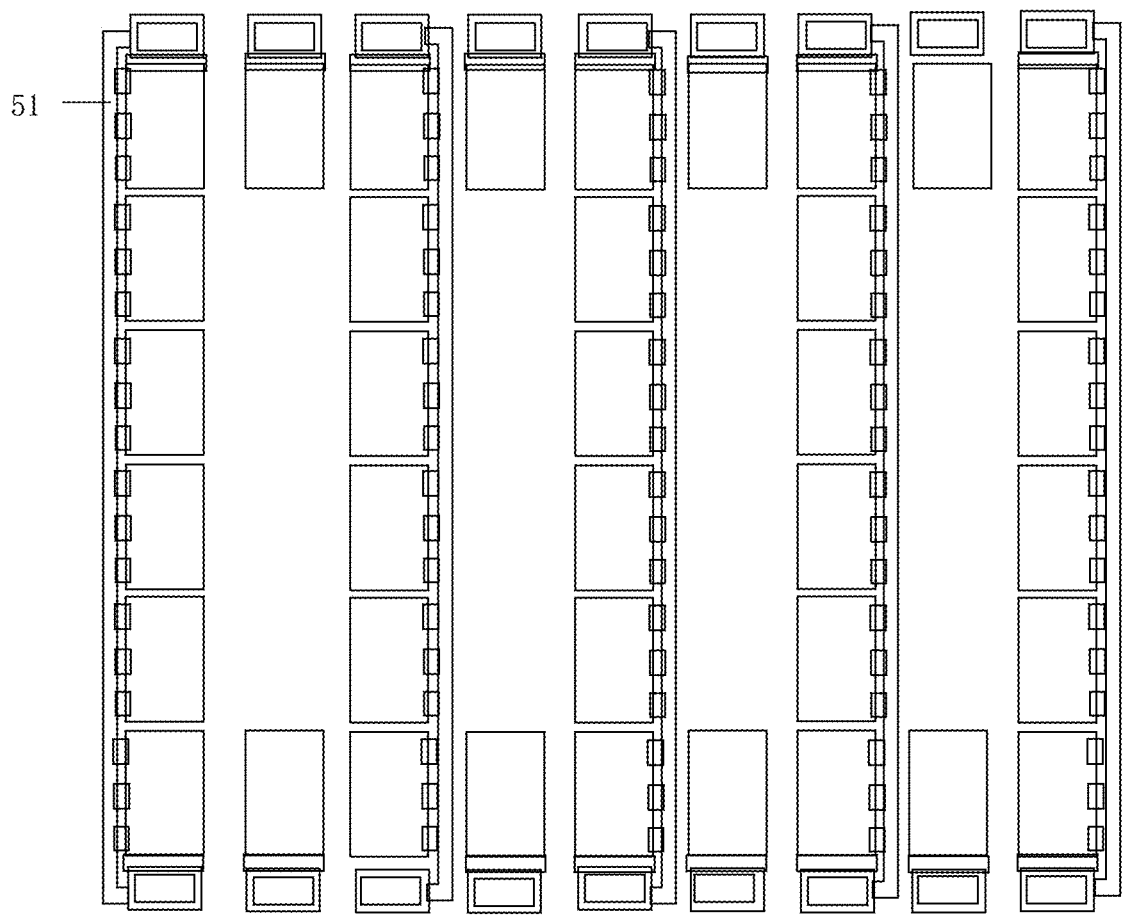
FIG. 5 illustrates a plan structural view of a trace layer according to one embodiment of the present disclosure.

Referring to FIG. 5 which illustrates the structural view of the trace layer, the trace 51 in the trace layer 15 is used for connecting the second electrode 123 to the bind electrode 13.

Figure 6:
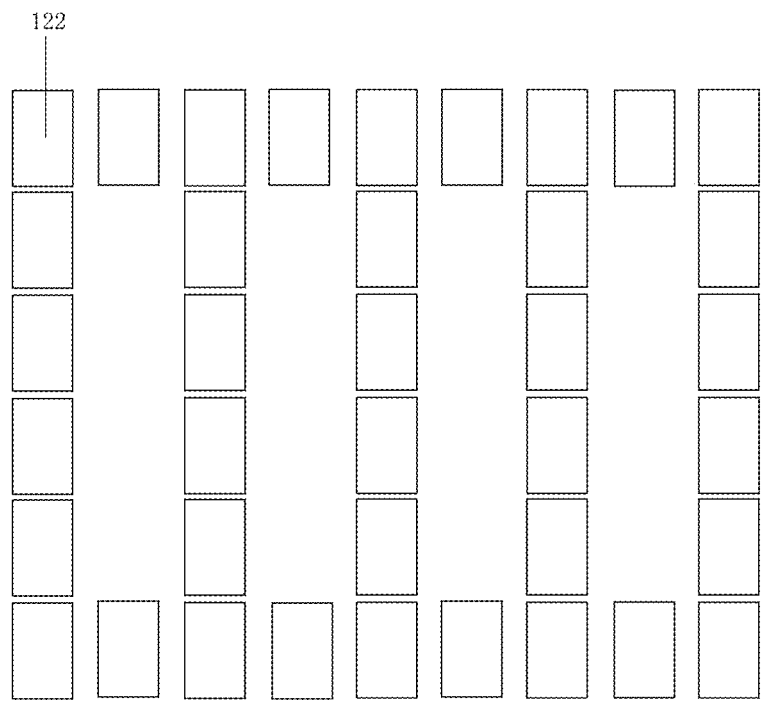
FIG. 6 illustrates a plan structural view of piezoelectric material layers according to one embodiment of the present disclosure.
Figure 7:
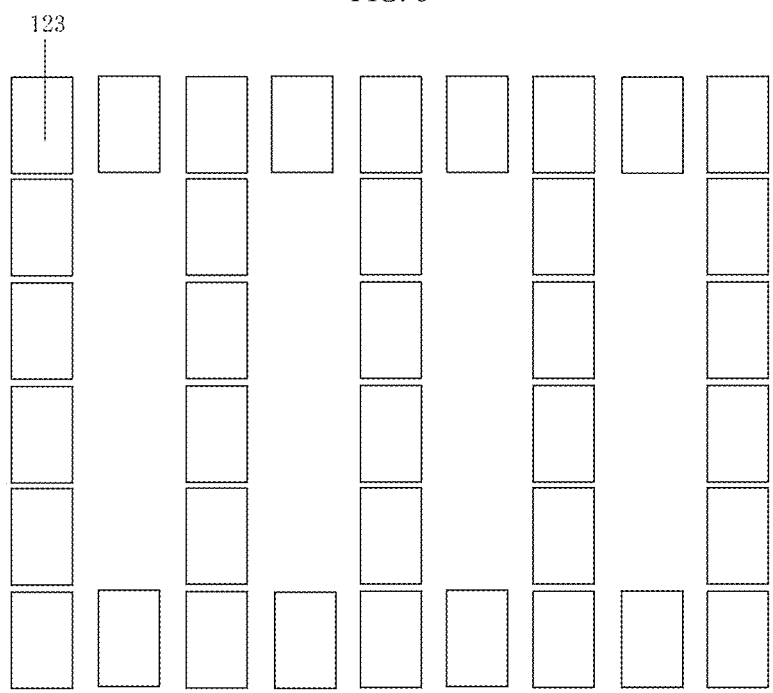
FIG. 7 illustrates a plan structural view of second electrodes according to one embodiment of the present disclosure.

It should be noted that the first electrodes 121 of all the deformation units 12 may be communicated with each other. In this embodiment, to reduce the parasitic capacitance, the first electrodes 121 in the same column are communicated with each other, as shown in FIG. 3. Referring to FIG. 6 which illustrates the structural view of the piezoelectric material layers and FIG. 7 which illustrates the structural view of the second electrodes, the piezoelectric material layers of the deformation units 12 may be separated, and the second electrodes 123 of the deformation units 12 may also be separated, which is beneficial to maintenance. For example, when a short circuit happens to one deformation unit 12, the second electrode 123 of this deformation unit 12 may be isolated, such that other deformation units 12 will not be affected by the short circuit point.

To reduce the risk of short circuits, referring to FIG. 1, edges of the second electrodes 123 may be indented relative to edges of the piezoelectric material layer 122. In actual implementation, indentation distances of the edges of the second electrode 123 relative to the edges of the piezoelectric material layer 122 are greater than or equal to 100 μm and less than or equal to 500 μm, such as 150 μm.

To further reduce the risk of short circuits, the edges of the piezoelectric material layer 122 may be indented with respect to edges of the first electrode 121.

Figure 13:
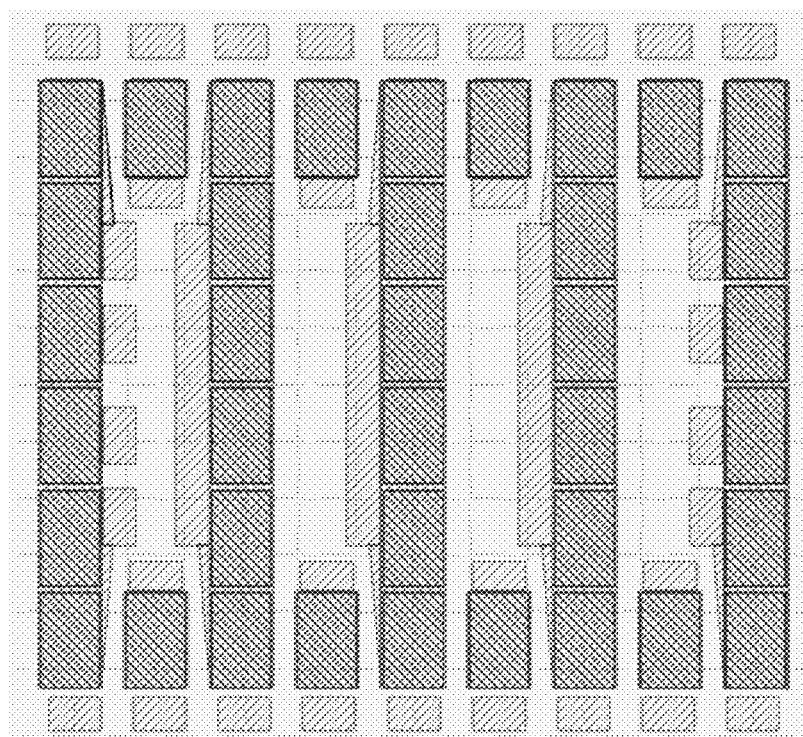
FIG. 13 illustrates a plan structural view after a piezoelectric material layer is prepared according to one embodiment of the present disclosure.
Figure 14:
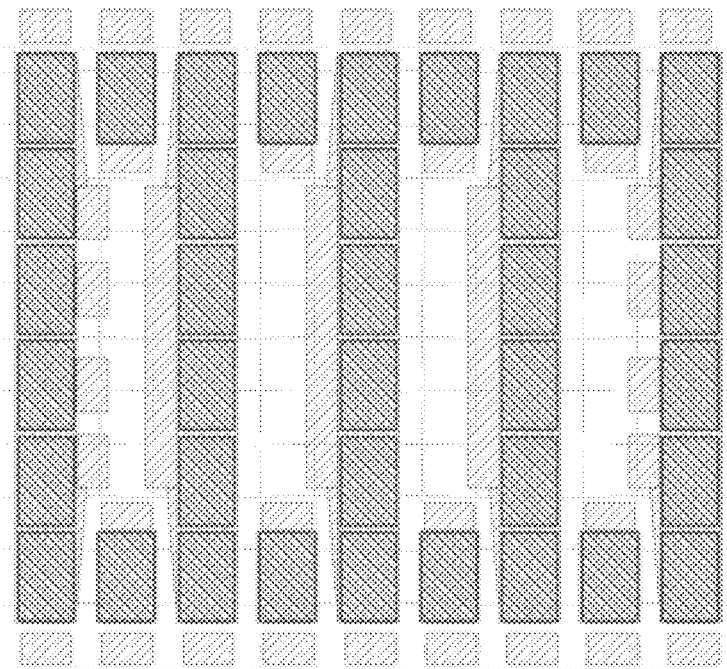
FIG. 14 illustrates a plan structural view after a second electrode layer is prepared according to one embodiment of the present disclosure.
Figure 15:
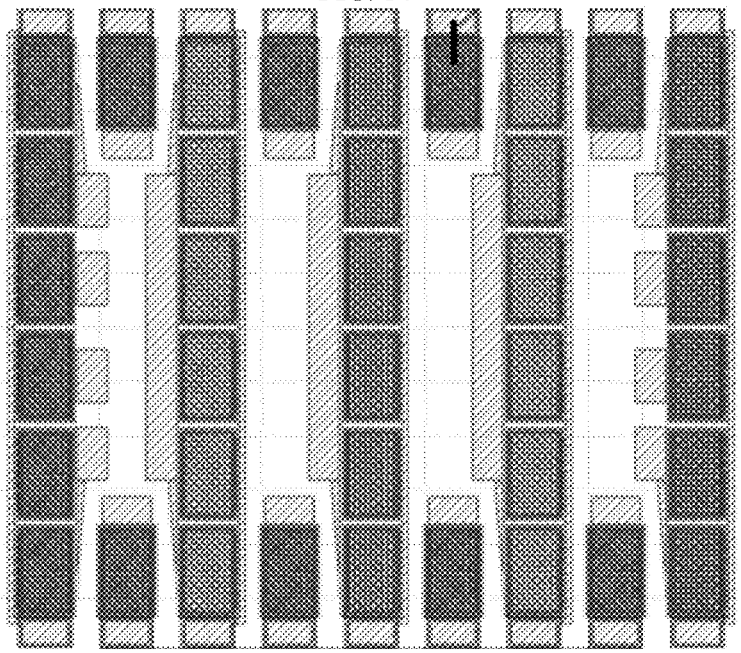
FIG. 15 illustrates a plan structural view after a trace layer is prepared according to one embodiment of the present disclosure.

In an actual fabrication process, the first electrode 121, the piezoelectric material layer 122, the second electrode 123, the insulating layer 14 and the trace layer 15 may be sequentially formed on the substrate 11. Please refer to FIG. 3 which illustrates a plan structural view after the first electrodes are prepared, FIG. 13 which illustrates a plan structural view after a piezoelectric material layer is prepared, FIG. 14 which illustrates a plan structural view after the second electrodes are prepared, and FIG. 15 which illustrates a plan structural view after the trace layer is prepared. Wherein, FIG. 1 illustrates a sectional structural view of the part, marked with the thick black line, in FIG. 15.

In one optional embodiment, referring to a in FIG. 2, multiple deformation units 12 are configured and are arranged on one side of the substrate 11 in an array, the first electrodes 121 of the deformation units 12 in the same column are communicated with each other (as shown in FIG. 3), and the second electrodes 123 of the deformation units 12 in the same column are connected to the same trace 51 in the trace layer 15 (as shown in FIG. 5), that is, the second electrodes 123 of the deformation units 12 in the same column are communicated with each other by means of the same trace 51 in the trace layer 15. In this way, the deformation units 12 with the first electrodes 121 being communicated with each other and the second electrodes 123 being communicated with each other in the same column may be driven synchronously, and column drive is realized. It should be noted that when all the deformation units 12 on the haptic feedback base plate need to be driven synchronously, all the second electrodes 123 may be communicated by means of the trace in the trace layer 15.

Figure 8:
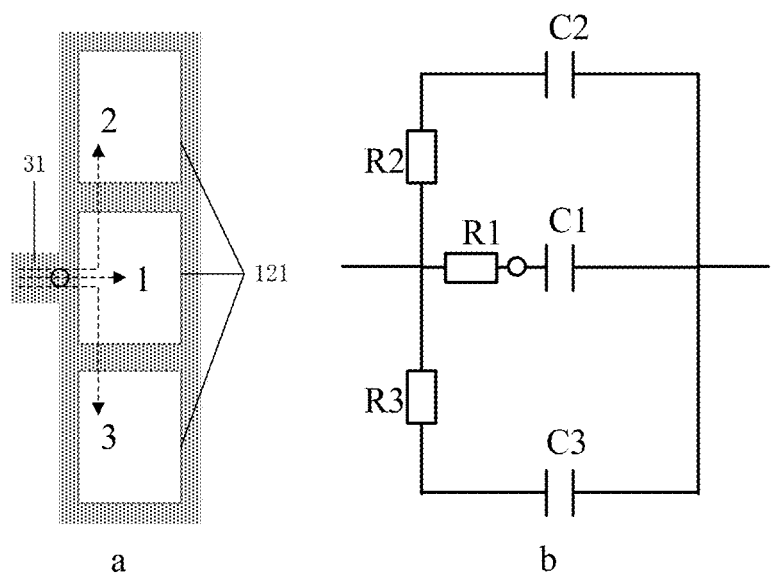
FIG. 8 illustrates a structural view and an equivalent circuit diagram of first electrodes and a lead electrode according one embodiment of the present disclosure.

The inventor finds that when one lead electrode 31 is connected to multiple first electrodes 121, referring to a in FIG. 8 which illustrates the structural view of the first electrodes 121 and the lead electrode 31 and b in FIG. 8 which illustrates an equivalent circuit diagram of the first electrodes 121 and the lead electrode 31, the resistance R1 between the first electrode 121 close to the lead electrode 31 (the first electrode in the middle) and the lead electrode 31 is small, the resistances R2 and R3 between the first electrodes 121 away from the lead electrode 31 and the lead electrode 31 are large, that is, R1<<R2, and R1<<R3; and under a high voltage such as an alternating peak voltage $V_{ac,pp}$>40V, or a direct current $V_{DC}$>14V, the local current density between the first electrode 121 close to the lead electrode 31 and the lead electrode 31 is large, which is likely to cause a burnout of the circuit.

To solve the above problem, in one optional embodiment, when the lead electrode 31 is connected to multiple first electrodes 121, the resistances between the lead electrode 31 and all the first electrodes 121 may be set to be equal.

Figure 9:
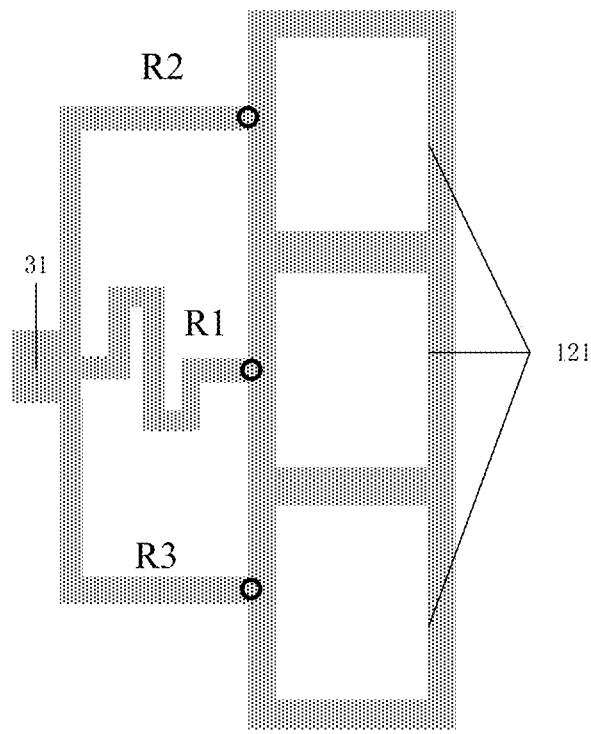
FIG. 9 illustrates a first improved structural view of the first electrode and the lead electrode according to one embodiment of the present disclosure.

In specific implementation, according to the resistance calculation formula R=ρ×ℓ/A, the resistance difference may be decreased by extending the length of the trace between the first electrode 121 close to the lead electrode 31 and the lead electrode 31, to ensure R1=R2=R3 to realize uniform distribution of the current density is realized, as shown in FIG. 9.

Figure 10:
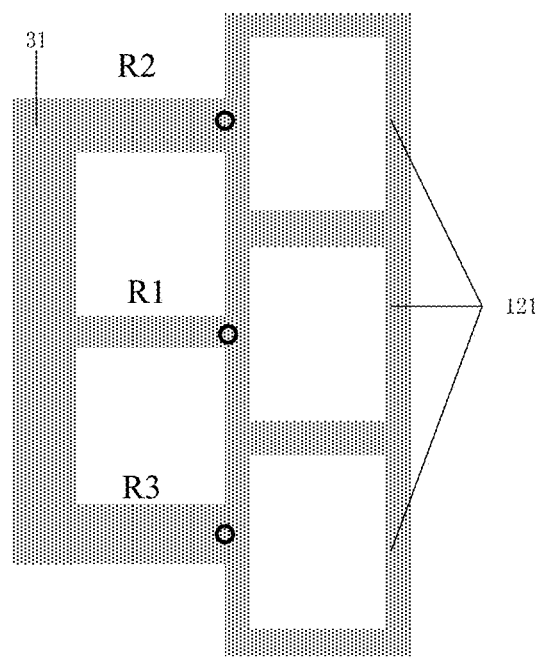
FIG. 10 illustrates a second improved structural view of the first electrode and the lead electrode according to one embodiment of the present disclosure.

In addition, the resistance difference may also be decreased by reducing the width of the trace between the first electrode 121 close to the lead electrode 31 and the lead electrode 31, to ensure R1=R2=R3 to realize uniform distribution of the current density, as shown in FIG. 10.

In this embodiment, the current density generated by a drive electric signal in the circuit may be dispersed or uniformized by adjusting the length and/or width of the trace between the first electrodes 121 and the lead electrode 31 to reduce device failures caused by an excessive local current density.

One embodiment of the present disclosure further provides a haptic feedback apparatus, comprising the haptic feedback base plate in any one of the above-mentioned embodiments.

Figure 11:
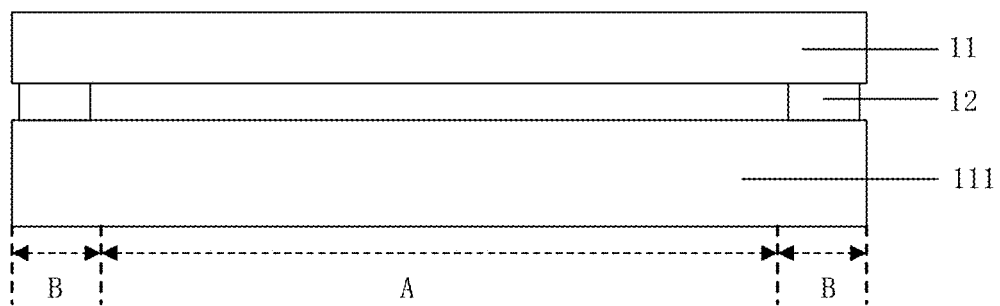
FIG. 11 illustrates a sectional structural view of a first haptic feedback apparatus according to one embodiment of the present disclosure.

In one optional embodiment, referring to FIG. 11, the haptic feedback apparatus may further comprise: a displaying substrate 111 disposed on a side, away from the substrate 11, of the deformation unit 12, wherein the displaying substrate 111 comprises an active area A and a peripheral area B located on the periphery of the active area A, and an orthographic projection of the deformation unit 12 on the displaying substrate 111 is located in the peripheral area B.

In specific implementation, when the peripheral area B of the displaying substrate 111 is located on left and right sides of the active area A, two rows of deformation units 12 may be configured and located in the peripheral area B on the left and right sides respectively, as shown in FIG. 11. Of course, only one column of deformation units 12 may be configured and located in the peripheral area B on the left or right side. Each column of deformation units 12 may include multiple deformation units 12.

In this embodiment, no deformation unit 12 is disposed in the active area A, such that the transmittance of the haptic feedback base plate is further improved.

Figure 12:
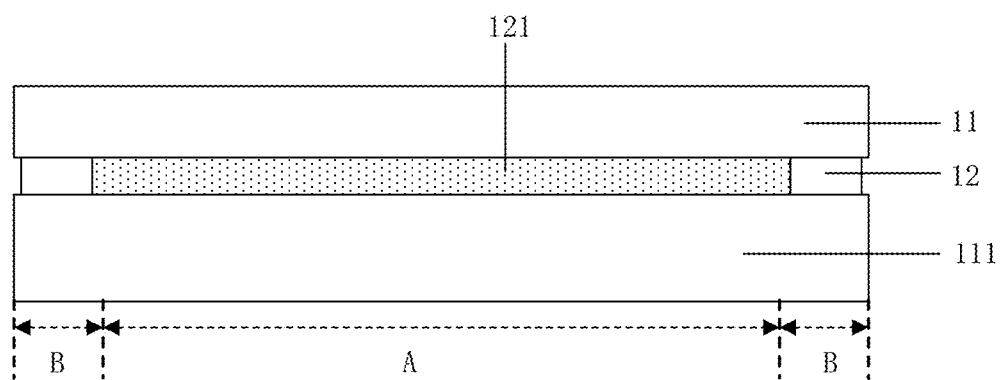
FIG. 12 illustrates a sectional structural view of a second haptic feedback apparatus according to one embodiment of the present disclosure.

In one optional embodiment, referring to FIG. 12, a touch functional layer 121 may be disposed on a side, close to the displaying substrate 111, of the substrate 11, the touch functional layer 121 may be a touch electrode layer or a touch film, and an orthographic projection of the touch electrode layer or the touch film (namely the touch functional layer 121) on the displaying substrate 111 covers the active area A.

In specific implementation, the side, close to the displaying substrate 111, of the substrate 11 is provided with a transparent ITO touch screen trace or is attached with a transparent touch film to realize a touch function. The active area A may be located within the orthographic projection of the touch functional layer 121 on the displaying substrate 111 or completely overlap with the orthographic projection of the touch functional layer 121 on the displaying substrate 111, this embodiment has no limitation in this aspect.

It should be noted that the transmittance of the deformation unit 12 in the haptic feedback base plate is high, so the orthographic projection of the deformation unit 12 on the displaying substrate 111 may be located in the active area A. The specific configuration may be designed as actually needed.

One embodiment of the present disclosure further provides a haptic feedback method applied to the haptic feedback base plate in any one of the above-mentioned embodiments. The haptic feedback method comprises:

voltage signals are applied to the first electrode 121 and the second electrode 123 respectively to form an alternating electric field between the first electrode 121 and the second electrode 123, and a piezoelectric material layer 122 vibrates under the effect of the alternating electric field and drives the substrate 11 to resonate, wherein a difference between a frequency of the alternating electric field and an inherent frequency of the substrate 11 is less than or equal to a preset threshold.

Wherein, the voltage signal applied to the first electrode 121 may be a grounding voltage signal, and the voltage signal applied to the second electrode 123 may be an alternating voltage signal. The frequency of the alternating voltage signal may be close or equal to the inherent frequency of the substrate 11.

The embodiments of the present disclosure provide a haptic feedback base plate, a haptic feedback apparatus and a haptic feedback method. Wherein, the haptic feedback base plate comprises: a substrate and a deformation unit disposed on one side of the substrate, the deformation unit comprises a first electrode, a piezoelectric material layer and a second electrode that are arranged in a stacked manner, the first electrode is arranged close to the substrate, the first electrode and the second electrode are used to form an alternating electric field, and the piezoelectric material layer vibrates under the effect of the alternating electric field and drives the substrate to resonate; wherein, a difference between a frequency of the alternating electric field and an inherent frequency of the substrate is less than or equal to a preset threshold. According to the technical solution of the present disclosure, voltage signals are applied to the first electrode and the second electrode respectively to form an alternating electric field between the first electrode and the second electrode, the piezoelectric material layer deforms under the effect of the alternating electric field, and when the frequency of the alternating electric field is close to the inherent frequency of the substrate, the substrate is driven to resonate to improve the vibration amplitude, such that haptic feedback is realized on the surface of the substrate.

The embodiments in the specification are described progressively, the differences from other embodiments are emphatically stated in each embodiment, and the similarities of these embodiments can be cross-referenced.

Finally, it should be noted that relational terms such as "first" and "second" in this specification are merely used to distinguish one entity or operation from the other one, and do not definitely indicate or imply that these entities or operations have any actual relations or sequences. In addition, the term "comprise" or "include" or other variations are intended to refer to non-exclusive inclusion, so that a process, method, article or terminal device comprising a series of elements not only comprises these elements listed, but also comprises other elements that are not clearly listed, or inherent elements of the process, method, article or terminal device. Unless otherwise clearly specified, an element defined by the expression "comprise a" shall not exclusive of other identical elements in a process, method, article or terminal device comprising said element.

The haptic feedback base plate, the haptic feedback apparatus, and the haptic feedback method provided by the present disclosure are described in detail above. Specific examples are used in the disclosure to illustrate the principles and implementations of the present disclosure. The description of the above embodiments is only used to help understand the methods and core ideas of the present disclosure; at the same time, for those of ordinary skill in the art, according to the ideas of the present disclosure, there will be changes in the specific implementation and scope of application. In summary, the content of this specification should not be construed as a limitation on this application.

"One embodiment", "an embodiment" or "one or more embodiments" in this specification means that specific features, structures, or characteristics described in conjunction with said embodiment are included in at least one embodiment of the disclosure. In addition, it should be noted that the expression "in one embodiment" does not definitely refer to the same embodiment.

A great number of specific details are provided in this specification. However, it can be understood that the embodiments of the application can be implemented even without these specific details. In some embodiments, known methods, structures and techniques are not stated in detail to ensure that the understanding of this specification will not be obscured.

In the Claims, any reference marks should not be construed as limitations of the Claims. The term "comprise" shall not exclude the existence of elements or steps not listed in the Claims. "A/an" or "one" before an element shall not exclude the possibility of multiple said elements. The application may be implemented by means of hardware comprising a plurality of different elements and a properly programmed computer. In a Claim in which a plurality of devices are listed, several of these devices may be specifically implemented by means of the same hardware. Terms such as "first", "second" and "third" do not indicate any order, and may be interpreted as names.

Finally, it should be noted that the above embodiments are merely used to explain the technical solutions of the application, and are not intended to limit the application. Although the application has been explained in detail with reference to the above embodiments, those ordinarily skilled in the art would appreciate that the technical solutions recorded in these embodiments can still be amended or part of the technical features in these embodiments can be equivalently substituted without causing the essence of corresponding technical solutions to deviate from the spirit and scope of the technical solutions of these embodiments.

The invention claimed is:

1. A haptic feedback base plate, comprising:
   a substrate and a deformation unit disposed on a side of the substrate, wherein the deformation unit comprises a first electrode, a piezoelectric material layer and a second electrode that are arranged in a stacked manner, the first electrode is arranged close to the substrate, the first electrode and the second electrode are configured to form an alternating electric field, and the piezoelectric material layer vibrates under the effect of the alternating electric field and drives the substrate to resonate;
   wherein, a difference between a frequency of the alternating electric field and an inherent frequency of the substrate is less than or equal to a preset threshold;
   wherein the deformation unit is arranged at a vibration crest and/or a vibration trough of a vibration signal of the substrate.

2. The haptic feedback base plate according to claim 1, further comprising:
   a bind electrode disposed on a same layer with the first electrode, wherein the bind electrode is arranged close to an edge of the substrate and is configured to connect a drive voltage input terminal, and a voltage signal input by the drive voltage input terminal is an alternating voltage signal; and
   an insulating layer and a trace layer that are disposed on a side, away from the substrate, of the second electrode, wherein the trace layer comprises a trace having one end connected to the second electrode through a first via hole formed in the insulating layer and the other end connected to the bind electrode through a second via hole formed in the insulating layer.

3. The haptic feedback base plate according to claim 2, further comprising:
   a lead electrode disposed on a same layer with the first electrode, wherein the lead electrode is connected to the first electrode and is configured to connect a grounding voltage input terminal, and a voltage signal input by the grounding voltage input terminal is a grounding voltage signal.

4. The haptic feedback base plate according to claim 3, wherein when the lead electrode is connected to a plurality of the first electrodes, resistances between the lead electrode and each of the plurality of the first electrodes are equal.

5. The haptic feedback base plate according to claim 2, wherein a plurality of the deformation units are provided, the plurality of the deformation units are arranged on one side of the substrate in an array, the first electrodes of the deformation units in a same column are communicated with each other, and the second electrodes of the deformation units in the same column are connected to a same trace in the trace layer.

6. The haptic feedback base plate according to claim 1, wherein in a plane parallel to the substrate, a size of the deformation unit is less than a half-wavelength of vibrations of the substrate.

7. The haptic feedback base plate according to claim 1, wherein a thickness of the piezoelectric material is greater than or equal to 1 μm and less than or equal to 10 μm.

8. The haptic feedback base plate according to claim 1, wherein edges of the second electrode are indented relative to edges of the piezoelectric material layer.

9. The haptic feedback base plate according to claim 8, wherein indentation distances of the edges of the second electrode relative to the edges of the piezoelectric material layer are greater than or equal to 100 μm and less than or equal to 500 μm.

10. The haptic feedback base plate according to claim 1, wherein the edges of the piezoelectric material layer are indented relative to edges of the first electrode.

11. A haptic feedback apparatus, comprising the haptic feedback base plate according to claim 1.

12. The haptic feedback apparatus according to claim 11, further comprising: a displaying substrate disposed on a side, away from the substrate, of the deformation unit, wherein the displaying substrate comprises an active area and a peripheral area located on a periphery of the active area, and an orthographic projection of the deformation unit on the displaying substrate is located within the peripheral area.

13. The haptic feedback apparatus according to claim 12, wherein a touch electrode layer or a touch film is disposed on a side, close to the displaying substrate, of the substrate, and an orthographic projection of the touch electrode layer or the touch film on the displaying substrate covers the active area.

14. A haptic feedback method, wherein the haptic feedback method is applied to the haptic feedback base plate according to claim 1, and the method comprises:
   applying voltage signals to the first electrode and the second electrode, respectively, to form an alternating electric field between the first electrode and the second electrode, and enabling the piezoelectric material layer to vibrate under the effect of the alternating electric field and drive the substrate to resonate, wherein a difference between a frequency of the alternating electric field and an inherent frequency of the substrate is less than or equal to a preset threshold.

* * * * *